United States Patent
Mei et al.

(10) Patent No.: US 12,029,252 B2
(45) Date of Patent: Jul. 9, 2024

(54) SYSTEM, METHOD, DEVICE, AND ELECTRONIC ATOMIZING DEVICE FOR DETECTING NICOTINE CONTENT IN E-LIQUID

(71) Applicant: SHENZHEN SMOORE TECHNOLOGY LIMITED, Shenzhen (CN)

(72) Inventors: Jiagang Mei, Shenzhen (CN); Shengkui Liu, Shenzhen (CN); Chunfeng Zhang, Shenzhen (CN)

(73) Assignee: SHENZHEN SMOORE TECHNOLOGY LIMITED, Shenzhen (CN)

( * ) Notice: Subject to any disclaimer, the term of this patent is extended or adjusted under 35 U.S.C. 154(b) by 703 days.

(21) Appl. No.: 17/186,227

(22) Filed: Feb. 26, 2021

(65) Prior Publication Data

US 2021/0289846 A1    Sep. 23, 2021

(30) Foreign Application Priority Data

Mar. 20, 2020 (CN) .......................... 202010200378.1

(51) Int. Cl.
*B01L 3/00*     (2006.01)
*A24F 40/53*    (2020.01)
(Continued)

(52) U.S. Cl.
CPC .............. *A24F 40/53* (2020.01); *A24F 40/60* (2020.01); *G01N 27/028* (2013.01); *G01R 27/22* (2013.01)

(58) Field of Classification Search
CPC .......... A24F 40/53; A24F 40/60; A24F 40/10; A24F 40/51; G01N 27/028; G01N 27/06; G01R 27/22
See application file for complete search history.

(56) References Cited

U.S. PATENT DOCUMENTS

2015/0101625 A1   4/2015  Newton et al.
2015/0272220 A1  10/2015  Spinka et al.
(Continued)

FOREIGN PATENT DOCUMENTS

CN   106263035 A   1/2017
CN   108143001 A   6/2018
(Continued)

OTHER PUBLICATIONS

Office Action for Chinese Patent Application No. 202010200378.1 mailed Jul. 27, 2022.
(Continued)

*Primary Examiner* — Jennifer Wecker
*Assistant Examiner* — Oyeleye Alexander Alabi
(74) *Attorney, Agent, or Firm* — Dorsey & Whitney LLP

(57) ABSTRACT

The present disclosure relates to a system, a method, a device, and an electronic atomizing device for detecting a nicotine content in an e-liquid. The system includes: a sampling circuit configured to acquire characteristic parameters, and the characteristic parameters being configured to calculate an impedance of the e-liquid in an e-liquid containing component; and a controller electrically connected to the sampling circuit, configured to calculate the impedance of the e-liquid according to the characteristic parameters fed back by the sampling circuit, and determine the nicotine content in the e-liquid according to the impedance of the e-liquid and a preset corresponding relation between the impedance and the nicotine content.

16 Claims, 6 Drawing Sheets

(51) Int. Cl.

| | | |
|---|---|---|
| *A24F 40/60* | (2020.01) | |
| *B01F 23/00* | (2022.01) | |
| *B01F 23/41* | (2022.01) | |
| *B01F 101/23* | (2022.01) | |
| *B23Q 17/24* | (2006.01) | |
| *C12Q 1/18* | (2006.01) | |
| *G01N 21/64* | (2006.01) | |
| *G01N 27/02* | (2006.01) | |
| *G01N 33/50* | (2006.01) | |
| *G01R 27/22* | (2006.01) | |

(56) References Cited

U.S. PATENT DOCUMENTS

| | | | | |
|---|---|---|---|---|
| 2017/0231277 A1* | 8/2017 | Mironov | ............... | A24F 40/40 392/404 |
| 2019/0357598 A1 | 11/2019 | Qiu | | |
| 2022/0232889 A1* | 7/2022 | Zinovik | ............... | A24F 40/10 |
| 2023/0115077 A1* | 4/2023 | Chen | ............... | G01F 23/266 131/329 |

FOREIGN PATENT DOCUMENTS

| | | |
|---|---|---|
| CN | 108471812 A | 8/2018 |
| CN | 109963606 A | 7/2019 |
| WO | 2015140312 A1 | 9/2015 |
| WO | 2020260414 A1 | 12/2020 |

OTHER PUBLICATIONS

Extended European search report issued in European Application No. 21161922.6, mailed on Aug. 18, 2021, 9 pages.

Second Office Action for Chinese Patent Application No. 202010200378.1 mailed Mar. 11, 2023.

* cited by examiner

SYSTEM, METHOD, DEVICE, AND ELECTRONIC ATOMIZING DEVICE FOR DETECTING NICOTINE CONTENT IN E-LIQUID

CROSS REFERENCE TO RELATED APPLICATION

This application claims priority to Chinese Patent Application No. 202010200378.1, filed on Mar. 20, 2020, the entire content of which is incorporated herein in its entirety.

TECHNICAL FIELD

The present disclosure relates to a technical field of e-liquid detection, and in particular, to a system, a method, a device, and an electronic atomizing device for detecting a nicotine content in an e-liquid.

BACKGROUND

Electronic cigarettes, also known as virtual cigarettes and electronic atomizing devices, are used as substitutes for cigarettes and are also used to quit smoking. Electronic cigarettes have a similar appearance and taste to the cigarettes, but generally do not contain harmful components such as tar and suspended particles in the cigarettes.

A conventional e-cigarette is to form smoke by atomizing e-liquid for users to inhale. E-liquid contains nicotine. The nicotine is an alkaloid that exists in Solanaceae plant (a Solanum). The nicotine contained in the e-liquid belongs to free nicotine. The nicotine content of different brands or different types of e-liquid on the market varies, and the nicotine content is also an important indicator for users to choose the e-liquid. The nicotine can stimulate a central nervous of the human brain to enable it to generate a sense of excitement, and thus is also used for a treatment of brain diseases. However, excessive intake of the nicotine will cause dependence, and long-term large intake will increase a risk of a cardiovascular disease such as high blood pressure, or stroke and a lung disease.

Therefore, more and more countries have formulated many e-cigarette-related regulations in order to reduce the harm caused by the use of electronic atomizing devices by young people, including a need to clearly identify the nicotine content in a cartridge or an atomizer of the electronic atomizing device. For the cartridges, most cartridges are closed structures. Users cannot fill the cartridges with the e-liquid by themselves. The nicotine content can be measured before leaving the factory and then labeled. However, for the atomizers or cartridges that can be filled with the e-liquid, it is difficult to be measured and labeled before leaving the factory, so it is necessary to consider a real-time detection of the nicotine content in the electronic atomizing device.

Currently, conventional nicotine detecting methods mainly include chromatography, spectroscopy, photometry, gravimetry, titration analysis, and the like, but these conventional detecting methods are complicated to operate, time-consuming, and require the use of multiple instruments to be implemented, and also require professionals. These can meet requirements of the measurement before leaving the factory, but the real-time detection cannot be achieved.

SUMMARY

According to various embodiments of the present disclosure, a system, a method, a device, and an electronic atomizing device for detecting a nicotine content in an e-liquid capable of detecting the nicotine content in the e-liquid in real time are provided.

A system for detecting a nicotine content in an e-liquid includes:
  a sampling circuit configured to acquire characteristic parameters, and the characteristic parameters being configured to calculate an impedance of the e-liquid in an e-liquid containing component; and
  a controller electrically connected to the sampling circuit, and configured to calculate the impedance of the e-liquid according to the characteristic parameters fed back by the sampling circuit, and determine the nicotine content in the e-liquid according to the impedance of the e-liquid and a preset corresponding relation between the impedance and the nicotine content.

In one of the embodiments, the sampling circuit includes:
  a sampling resistor configured to connect in series with the e-liquid containing component in a test circuit, and wherein test circuit is configured to apply a test voltage to the sampling resistor and the e-liquid containing component, the characteristic parameters include a voltage across the sampling resistor and a voltage across the e-liquid containing component after the test circuit applies the test voltage; and
  a voltage acquisition circuit configured to acquire the characteristic parameters and feed the characteristic parameters back to the controller.

The controller is configured to calculate the impedance of the e-liquid according to a preset resistance value of the sampling resistor and the characteristic parameters, and determine the nicotine content in the e-liquid according to the impedance of the e-liquid and the preset corresponding relation between the impedance and the nicotine content.

In one of the embodiments, the test circuit includes a pulse circuit configured to output a pulse voltage including a forward voltage as the test voltage.

The controller is further configured to drive the voltage acquisition circuit to acquire the characteristic parameters when the pulse circuit outputs the forward voltage, and to determine the nicotine content in the e-liquid after acquiring the characteristic parameters fed back by the voltage acquisition circuit.

In one of the embodiments, the pulse voltage further includes a reverse voltage, and is configured to balance an ionization of the e-liquid due to the forward voltage.

In one of the embodiments, the controller is electrically connected to the test circuit, and is further configured to recognize whether the e-liquid containing component is connected, and drive the test circuit to output the test voltage when recognizing that the e-liquid containing component is connected.

In one of the embodiments, the voltage acquisition circuit includes:
  a first amplifying circuit configured to amplify a voltage of the sampling resistor into a first amplified voltage and feed the first amplified voltage back to the controller; and
  a second amplifying circuit configured to amplify a voltage of the e-liquid into a second amplified voltage and feed the second amplified voltage back to the controller.

In one of the embodiments, the controller is further configured to determine feature information of the e-liquid according to a preset impedance test database and the impedance of the e-liquid, and generate feature prompt information configured to prompt a user of the feature information of the e-liquid currently used.

In one of the embodiments, the system further comprises a positioning unit configured to position a current geographic location.

The controller is further configured to determine whether the nicotine content in the e-liquid meets a nicotine content regulation of the current geographic location according to the current geographic location and a preset regional nicotine content regulation, and generates warning information when the nicotine content in the e-liquid does not meet the nicotine content regulation.

An electronic atomizing device includes the system as described above.

In one of the embodiments, the electronic atomizing device further includes:

a prompt component configured to generate prompt information from the nicotine content in the e-liquid, and the prompt information being configured to prompt a user of the nicotine content in the e-liquid currently used.

A method for detecting a nicotine content in an e-liquid includes:

obtaining characteristic parameters acquired by a sampling circuit, and the characteristic parameters being configured to calculate an impedance of the e-liquid in an e-liquid containing component;

calculating the impedance of the e-liquid according to the characteristic parameters; and determining the nicotine content in the e-liquid, according to the impedance of the e-liquid and a preset corresponding relation between the impedance and the nicotine content.

In one of the embodiments, the step of obtaining the characteristic parameters acquired by the sampling circuit includes:

outputting a driving signal, and wherein the driving signal is configured to drive a test circuit to output a test voltage, the test voltage is a pulse voltage including a forward voltage, the characteristic parameters include a voltage across a sampling resistor and a voltage across the e-liquid containing component for containing the e-liquid, when the forward voltage is applied, and the sampling resistor and the e-liquid containing component are connected in series in the test circuit.

acquiring the characteristic parameters when the test circuit outputs the forward voltage; and calculating the impedance of the e-liquid according to the characteristic parameters and a preset resistance value of the sampling resistor.

In one of the embodiments, the pulse voltage further includes a reverse voltage. The step of obtaining the characteristic parameters acquired by the sampling circuit further includes: using the reverse voltage to balance an ionization of the e-liquid due to the forward voltage.

In one of the embodiments, the step of outputting the driving signal includes:

detecting whether the e-liquid containing component is connected; and outputting the driving signal, if recognizing that the e-liquid containing component is connected.

In one of the embodiments, the method further includes: obtaining a current geographic location;

according to the current geographic location and a preset regional nicotine content regulation, determining whether the nicotine content in the e-liquid meets the regional nicotine content regulation of the current geographic location; and generating warning information, when the nicotine content regulation is not met.

A device for detecting a nicotine content in an e-liquid includes:

a characteristic parameter obtaining module configured to obtain characteristic parameters acquired by a sampling circuit, and the characteristic parameters being configured to calculate an impedance of the e-liquid in an e-liquid containing component;

a calculating module configured to calculate the impedance of the e-liquid according to the characteristic parameters;

a nicotine content determining module configured to determine the nicotine content of the e-liquid according to the impedance of the e-liquid and a preset corresponding relation between the impedance and the nicotine content.

A computer device includes a memory and a processor storing a computer program therein; when executing the computer program, the processor implements steps of the method as described above.

A computer-readable storage medium stores a computer program thereon; when the computer program is executed by a processor, steps of the method as described above are implemented.

The system, method, device, and electronic atomizing device for detecting a nicotine content in an e-liquid sample the characteristic parameters configured to calculate the impedance of the e-liquid in the e-liquid containing component via a sampling circuit and feed the characteristic parameters back to the controller. The controller calculates the impedance of the e-liquid according to the characteristic parameters, and then determines the nicotine content in the e-liquid according to the impedance of the e-liquid and the preset corresponding relation between the impedance and the nicotine content, which greatly shortens the detection time, and can perform the detection without complicated equipment, and which can be directly applied to the electronic atomizing device, to detect the nicotine content in the e-liquid in real-time.

DETAILED DESCRIPTION OF THE EMBODIMENTS

For the convenience of understanding of the present disclosure, the present disclosure will be described below more fully. However, the present disclosure can be implemented in many different forms and is not limited to the embodiments described herein. In contrast, providing these embodiments is to providing a fully and thoroughly understanding of the disclosure of the present disclosure.

It should be noted that when an element is considered to be "connected" to another element, it may be directly connected to another element and integrated with it, or there may be an intermediate element therebetween at the same time. Terms "mounted", "one end", "the other end" and the like used herein are for illustration only.

Unless otherwise defined, all technological and scientific terms used herein have the same meaning as commonly understood by those skilled in the technical field to which the present disclosure belongs. The terms used in the specification of the present disclosure herein are only for the purpose of describing specific embodiments, and are not intended to limit the present disclosure. The term "and/or" as used herein includes any and all combinations of one or more associated listed items.

Figure 1:
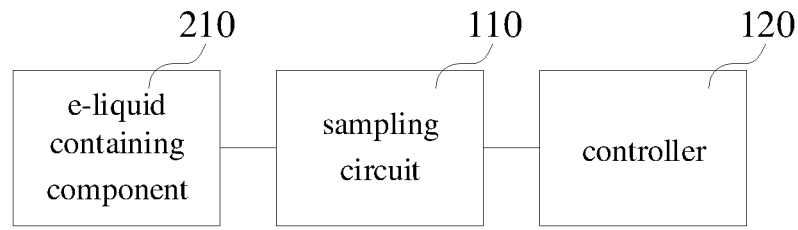
FIG. 1 is a schematic view of a system for detecting a nicotine content in an e-liquid according to an embodiment.

In one of the embodiments, as shown in FIG. 1, a system for detecting a nicotine content in an e-liquid is provided, and which includes a sampling circuit 110 and a controller 120.

The sampling circuit 110 is configured to acquire characteristic parameters. The characteristic parameters are configured to calculate an impedance of the e-liquid in an e-liquid containing component 210.

The controller 120 is electrically connected to the sampling circuit 110, and is configured to calculate the impedance of the e-liquid according to the characteristic parameters fed back by the sampling circuit 110, and determine the nicotine content in the e-liquid according to the impedance of the e-liquid and a preset corresponding relation between the impedance and the nicotine content.

The e-liquid containing component 210 is a component for containing the e-liquid. In one of the embodiments, the e-liquid containing component 210 is a cartridge. Depending on the specific application scenario, the cartridge can be a cartridge that can be self-filled with the e-liquid or a cartridge that cannot be self-filled with the e-liquid. In one of the embodiments, the e-liquid containing assembly 210 is an atomizer.

The characteristic parameters are used for the controller 120 to calculate the impedance of the e-liquid in the e-liquid containing component 210. The characteristic parameters may vary according to the selected calculation method. In one of the embodiments, if a double-volt method is used to calculate the impedance of the e-liquid, the characteristic parameters include a voltage across a sampling resistor and a voltage across the e-liquid containing component 210. In one of the embodiments, if a double-ampere method is used to calculate the impedance of the e-liquid, the characteristic parameters include a current flowing through the sampling resistor and a current flowing through the e-liquid containing component 210.

As the nicotine content in the e-liquid changes, an electrical conductivity of the e-liquid will change. The greater the electrical conductivity, the smaller the impedance, and the smaller the electrical conductivity, the greater the impedance. Therefore, a change in the electrical conductivity can be indirectly determined based on the difference in impedance by detecting the impedance of the e-liquid, so as to analyze the nicotine content in the e-liquid.

A large amount of data of a corresponding relation between the impedance and nicotine content of different brands and types of e-liquid are preset in the controller 120, and can also be acquired via real-time networking. The controller 120 calculates the impedance of the e-liquid according to the characteristic parameters fed back by the sampling circuit 110, and then determines the nicotine content in the e-liquid according to the corresponding relation between the impedance and the nicotine.

In one of the embodiments, the system for detecting the nicotine content in the e-liquid is applied to an electronic atomizing device, the controller 120 may be a microprocessor of the electronic atomizing device, and a test circuit may be a power supply of the electronic atomizing device. In one of the embodiments, the controller 120 can update the data of the corresponding relation between the impedance and the nicotine content via networking.

In one of the embodiments, the system for detecting the nicotine content in the e-liquid may also be applied to laboratory detection, and the controller may be a computer.

In the above-mentioned system for detecting the nicotine content in the e-liquid, the characteristic parameters configured to calculate the impedance of the e-liquid in the e-liquid containing component 210 are sampled via the sampling circuit 110, and fed back to the controller 120. The controller 120 calculates the impedance of the e-liquid according to the characteristic parameters, and then determines the nicotine content in the e-liquid according to the impedance of the e-liquid and the preset corresponding relation between the impedance and the nicotine content, which greatly shortens the detection time, which can performs the detection without complicated equipment, and can be directly applied to the electronic atomizing device, to detect the nicotine content in the e-liquid in real-time.

Figure 2:
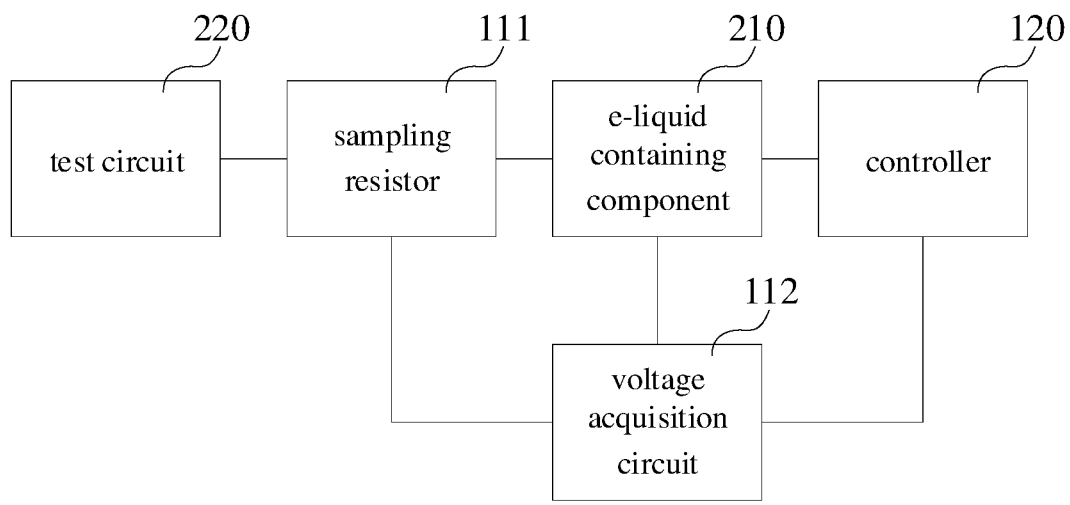
FIG. 2 is a schematic view of a sampling circuit according to an embodiment.

In one of the embodiments, as shown in FIG. 2, the sampling circuit 110 includes a sampling resistor 111 and a voltage acquisition circuit 112.

The sampling resistor 111 is configured to connect in series with the e-liquid containing component in a test circuit 220. The test circuit is configured to apply a test voltage to the sampling resistor and the e-liquid containing component. The characteristic parameters include a voltage across the sampling resistor 111 and a voltage across the e-liquid containing component 210 after the test circuit applies the test voltage.

The voltage acquisition circuit 112 is configured to acquire the characteristic parameters and feed them back to the controller 120.

The controller 120 is further configured to calculate the impedance of the e-liquid according to a preset resistance value of the sampling resistor 111 and the characteristic parameters, and determine the nicotine content in the e-liquid according to the impedance of the e-liquid and the preset corresponding relation between the impedance and the nicotine content.

In this embodiment, the double-volt method is used to detect the impedance of the e-liquid. That is, the sampling resistor 111 with a known resistance is connected in series with the e-liquid containing component 210. The controller 120 separately acquires the voltage across the sampling resistor 111 and the voltage across the e-liquid containing component 210. The controller 120 can calculate the impedance of the e-liquid in the e-liquid containing component 210 according to the law of partial pressure.

In one of the embodiments, a detection circuit can be further designed to detect the impedance of the e-liquid based on conventional resistance detection methods such as voltammetry, double-ampere method, single-ampere method, single-volt method or equivalent method.

In one of the embodiments, in the system for detecting the nicotine content in the e-liquid, the test circuit 220 includes a pulse circuit configured to output a pulse voltage including a forward voltage and a reverse voltage as the test voltage.

The controller is further configured to drive the voltage acquisition circuit to acquire the characteristic parameters when the pulse circuit outputs the forward voltage, and to determine the nicotine content in the e-liquid after acquiring the characteristic parameters fed back by the voltage acquisition circuit.

The test circuit 220 is configured to output a high-voltage forward voltage to the sampling resistor 111 and the e-liquid, so as to increase a current flowing through the e-liquid and the sampling resistor 111, thereby improving the detection accuracy. However, the forward voltage applied to the e-liquid for a long time will cause the e-liquid to ionize, resulting in a deviation in the detection data. Therefore, the reverse voltage is used to balance an ionization of the e-liquid.

Figure 3:
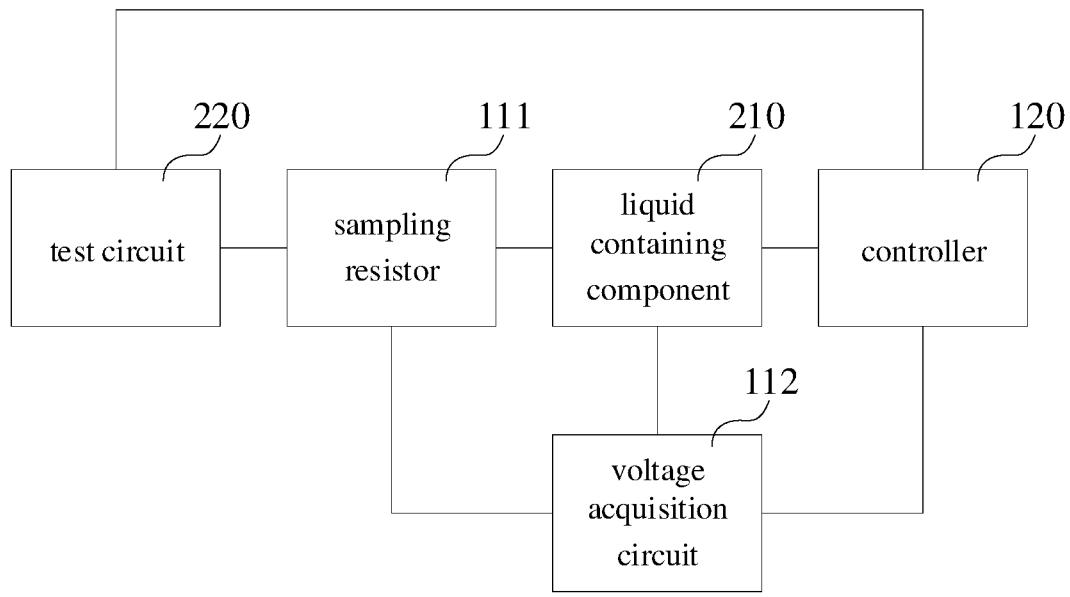
FIG. 3 is a schematic view of a system for detecting a nicotine content in an e-liquid according to another embodiment.

In one of the embodiments, as shown in FIG. 3, the controller 120 is electrically connected to the test circuit 220, and is further configured to recognize whether the e-liquid containing component 210 is connected, and drive the test circuit 220 to output the test voltage when recognizing that the e-liquid containing component 210 is connected.

In order to save power, until recognizing that the e-liquid containing component 210 is connected, the controller 120 drives the test circuit 220 to output the test voltage.

In one of the embodiments, the voltage acquisition circuit 112 includes a first amplifying circuit and a second amplifying circuit.

The first amplifying circuit is configured to amplify a voltage of the sampling resistor 111 into a first amplified voltage and feed it back to the controller 120.

The second amplifying circuit is configured to amplify a voltage of the e-liquid into a second amplified voltage and feed it back to the controller 120.

The voltage of the sampling resistor 111 and the voltage of the e-liquid are respectively amplified by the first amplifying circuit and the second amplifying circuit, and then fed back to the controller 120 to improve the detection accuracy. In one of the embodiments, the first amplifying circuit and the second amplifying circuit are both amplifying circuits constituted by operational amplifiers.

Figure 4:
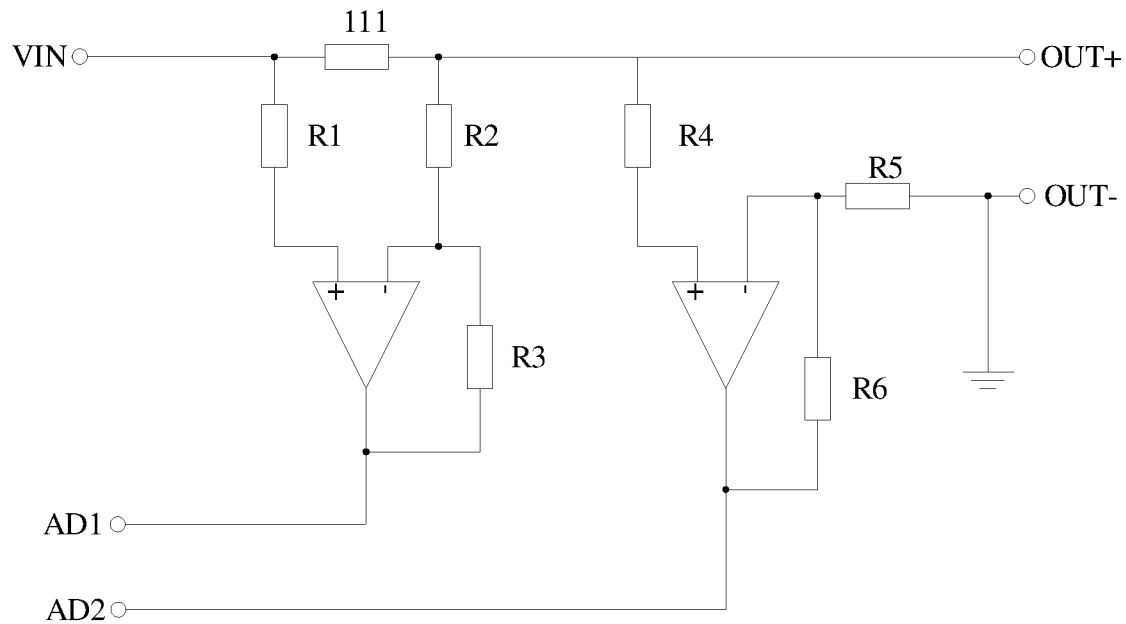
FIG. 4 is a schematic view of a first amplifying circuit and a second amplifying circuit according to an embodiment.

In one of the embodiments, as shown in FIG. 4, the first amplifying circuit/second amplifying circuit includes: a first resistor R1 (R4), a second resistor R2 (R5), a third resistor R3 (R6) and an operational amplifier. A first end of the first resistor R1 (R4) is electrically connected to a first end of the sampling resistor 111/a first end OUT+ of the e-liquid containing component 210, and a second end thereof is electrically connected to a positive input end of the operational amplifier. A first end of the second resistor R2 (R5) is electrically connected to a second end of the sampling resistor 111/a second end OUT− of the e-liquid containing component 210, and a second end thereof is electrically connected to a negative input end of the operational amplifier. A first end of the third resistor R3 (R6) is electrically connected to the negative input end of the operational amplifier, and a second end thereof is electrically connected to an output end of the operational amplifier. An input end of the controller is electrically connected to the output ends AD1/AD2 of the operational amplifier to acquire the amplified voltage data.

In one of the embodiments, the controller 120 is further configured to determine feature information of the e-liquid according to a preset impedance test database and the impedance of the e-liquid, and generate feature prompt information, which is configured to prompt the user of the feature information of the e-liquid currently used.

The difference in the composition of different brands of e-liquid may not only be the difference in nicotine content, the preset impedance test data can store the impedance test database of some different brands and models of e-liquid, and then the feature prompt information is generated to prompt the user by means of matching the corresponding feature information in the preset impedance test database according to the impedance of the e-liquid. The feature information may include, but is not limited to, the brand, type, taste, and the like of the e-liquid.

In one of the embodiments, the system for detecting the nicotine content in the e-liquid further includes a positioning unit configured to position a current geographic location.

The controller 120 is further configured to determine whether the nicotine content in the e-liquid meets a nicotine content regulation of the current geographic location according to the current geographic location and a preset regional nicotine content regulation, and generates warning information when the nicotine content in the e-liquid does not meet the nicotine content regulation.

Due to different countries and regions, there may be differences in the laws and regulations for the use of the electronic atomizing devices. If a user uses the electronic atomizing device across the regions, the user may violate the laws and regulations of the region where the user is located. Therefore, the controller 120 can position the user's current geographic location to determine a current region's regulation on the nicotine content in the electronic atomizing device, compare it with the detected nicotine content in the e-liquid, and generate the warning information if the regulation is not met. In one of the embodiments, the warning information is configured to instruct the electronic atomizing device to stop operating. In one of the embodiments, the power supply can be cut off when recognizing the warning information. In one of the embodiments, the warning information may be issued to the user in a prompt manner, prompting the user to turn off the electronic atomizing device by himself.

In one of the embodiments, an electronic atomizing device is further provided, which includes the system for detecting the nicotine content in the e-liquid according to any of the above-mentioned embodiments.

In one of the embodiments, the electronic atomizing device further includes a prompt component.

The prompt component is configured to generate prompt information from the nicotine content in the e-liquid. The prompt information is configured to prompt the user of the nicotine content in the e-liquid currently used.

The prompt component can be a component that prompts via light, voice, display, etc. After the system for detecting the nicotine content in the e-liquid of the electronic atomizing device detects the nicotine content in the e-liquid, the prompt information is generated, to prompt the user of the nicotine content in the e-liquid currently used.

Figure 5:
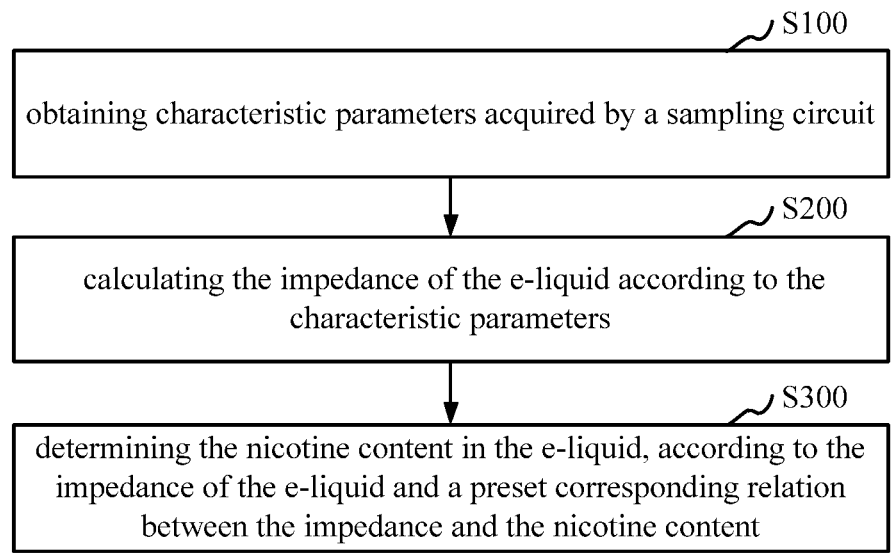
FIG. 5 is a schematic view of a flowchart of a method for detecting a nicotine content in an e-liquid according to an embodiment.

In one of the embodiments, as shown in FIG. 5, a method for detecting a nicotine content in an e-liquid is provided. Taking the method being applied to the controller 120 of the system for detecting the nicotine content in the e-liquid shown in FIG. 1 as an example for description, and the method includes steps of S100 to S300 as follows.

Step S100, obtaining characteristic parameters acquired by a sampling circuit. The characteristic parameters are configured to calculate an impedance of the e-liquid in an e-liquid containing component.

Step S200, calculating the impedance of the e-liquid according to the characteristic parameters.

Step S300, determining the nicotine content in the e-liquid, according to the impedance of the e-liquid and a preset corresponding relation between the impedance and the nicotine content.

As the nicotine content in the e-liquid changes, an electrical conductivity of the e-liquid will change. The greater the electrical conductivity, the smaller the impedance, and the smaller the electrical conductivity, the greater the impedance. Therefore, a change in the electrical conductivity can be indirectly determined based on the difference in impedance by detecting the impedance of the e-liquid, so as to analyze the nicotine content in the e-liquid. A large amount of data of a corresponding relation between the impedance and nicotine content of different brands and types of e-liquid is preset, and the controller 120 determines the nicotine content in the e-liquid according to the impedance of the e-liquid.

Figure 6:
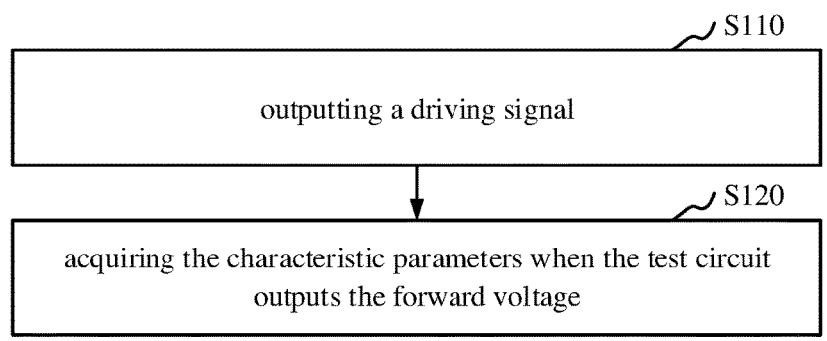
FIG. 6 is a schematic view of a flowchart of a step of obtaining characteristic parameters acquired by a sampling circuit according to an embodiment.

In one of the embodiments, as shown in FIG. 6, the step of obtaining the characteristic parameters acquired by the sampling circuit includes steps of S110 and S120:

Step S110, outputting a driving signal. The driving signal is configured to drive a test circuit to output a test voltage. The test voltage is a pulse voltage including a forward voltage and a reverse voltage. The characteristic parameters include a voltage across a sampling resistor and a voltage across the e-liquid containing component for containing the e-liquid, when the forward voltage is applied. The sampling resistor and the e-liquid containing component are connected in series in the test circuit.

Step S120: acquiring the characteristic parameters when the test circuit outputs the forward voltage.

Figure 7:
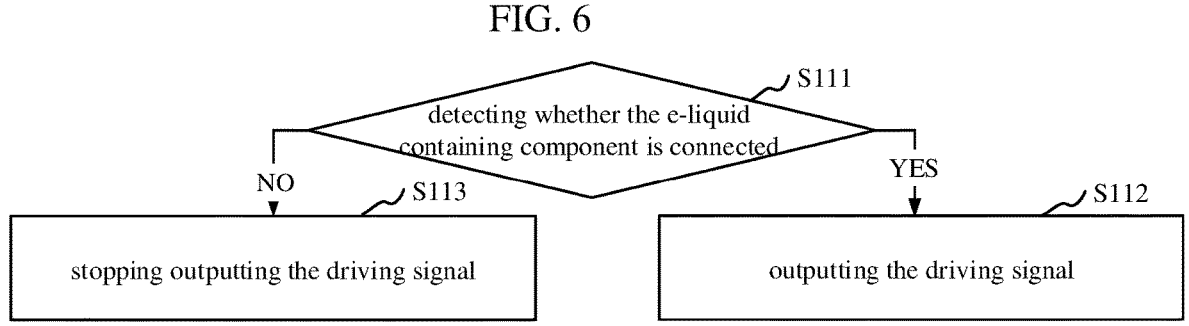
FIG. 7 is a schematic view of a flowchart of a step of outputting a driving signal according to an embodiment.

In one of the embodiments, as shown in FIG. 7, the step of outputting the driving signal includes steps of S111 to S113.

Step S111, detecting whether the e-liquid containing component is connected.

Step S112, outputting the driving signal, if recognizing that the e-liquid containing component is connected.

In order to save power, until recognizing that the e-liquid containing component 210 is connected, the controller 120 drives the test circuit 220 to output the pulse voltage, so as to avoid detecting the nicotine content in the e-liquid when the e-liquid containing component 210 is not connected. Outputting a high voltage pulse to the sampling resistor R0 and the e-liquid can increase a current flowing through the e-liquid and improve the detection accuracy. However, the forward voltage applied to the e-liquid for a long time will cause the e-liquid to ionize, resulting in a deviation in the detection data. Therefore, the reverse voltage is used to balance the ionization of the e-liquid.

Step S113, stopping outputting the driving signal, if recognizing that the e-liquid containing component is not connected.

Figure 8:
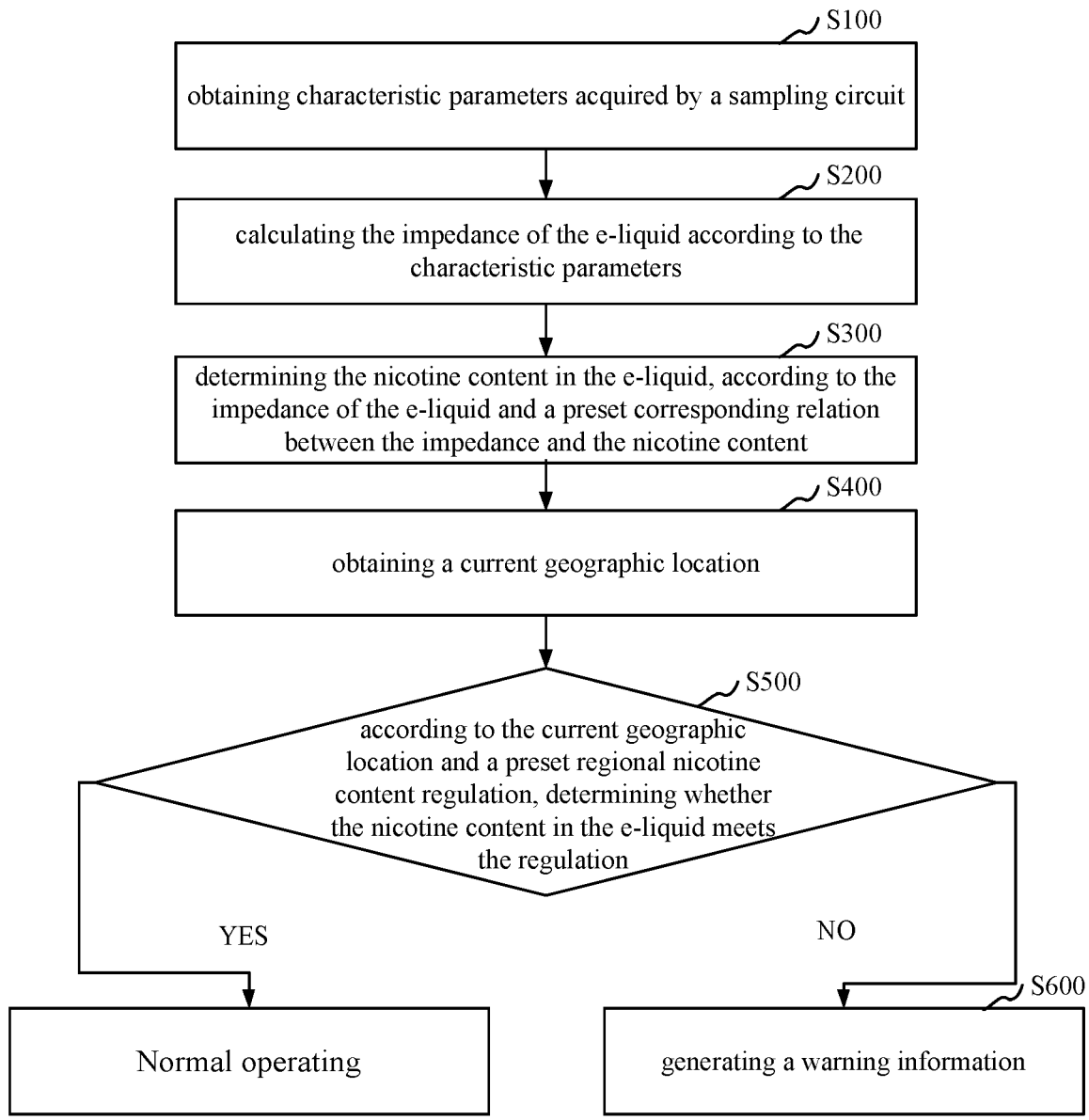
FIG. 8 is a schematic view of a flowchart of a method for detecting a nicotine content in an e-liquid according to another embodiment.

In one of the embodiments, the detection of the nicotine content in an e-liquid is shown in FIG. 8. The method for detecting the nicotine content in the e-liquid further includes steps of S400 to S600.

Step S400, obtaining a current geographic location.

Step S500, according to the current geographic location and a preset regional nicotine content regulation, determining whether the nicotine content in the e-liquid meets the regional nicotine content regulation of the current geographic location.

Step S600, generating warning information, if the nicotine content regulation is not met.

Due to different countries and regions, there may be differences in the laws and regulations for the use of the electronic atomizing devices. If a user uses the electronic atomizing device across the regions, the user may violate the laws and regulations of the region where the user is located. Therefore, the controller 120 can position the user's current geographic location to determine a current region's regulation on the nicotine content in the electronic atomizing device, compare it with the detected nicotine content in the e-liquid, and generate the warning information if the regulation is not met. The warning information is configured to instruct the electronic atomizing device to stop operating. In one of the embodiments, the power supply can be cut off when recognizing the warning information. In one of the embodiments, the warning information may be issued to the user in a prompt manner, prompting the user to turn off the electronic atomizing device by himself.

It should be understood that, although the various steps in the flowcharts of FIGS. 5 to 8 are displayed in sequence as indicated by arrows, these steps are not necessarily performed sequentially in the order indicated by the arrows. Unless clearly illustrated herein, performing these steps is not strictly restricted in order, and these steps can be performed in other orders. Moreover, at least part of the steps in FIGS. 5 to 8 may include multiple sub-steps or multiple stages. These sub-steps or stages are not necessarily performed at the same time, but can be performed at different times. These sub-steps or stages are not necessarily performed in sequence, but can be performed in turn with or alternately with at least part of other steps, or sub-steps or stages of the other steps.

Figure 9:
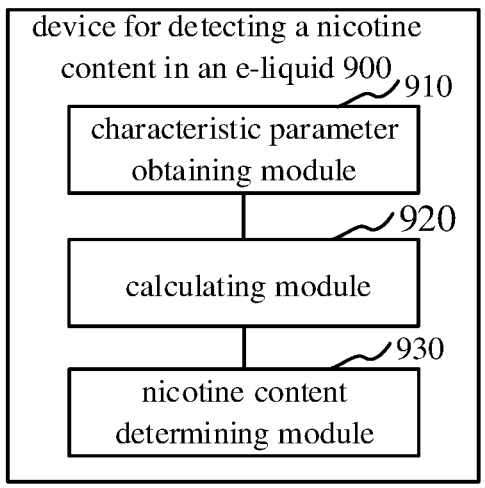
FIG. 9 is a block diagram of a device for detecting a nicotine content in an e-liquid according to an embodiment.

In one of the embodiments, as shown in FIG. 9, a device 900 for detecting a nicotine content in an e-liquid is provided, and which includes a characteristic parameter obtaining module 910, a calculating module 920, and a nicotine content determining module 930.

The characteristic parameter obtaining module 910 is configured to obtain characteristic parameters acquired by a sampling circuit. The characteristic parameters are configured to calculate an impedance of the e-liquid in an e-liquid containing component.

The calculating module 920 is configured to calculate the impedance of the e-liquid according to the characteristic parameters.

The nicotine content determining module 930 is configured to determine the nicotine content of the e-liquid according to the impedance of the e-liquid and a preset corresponding relation between the impedance and the nicotine content.

Figure 10:
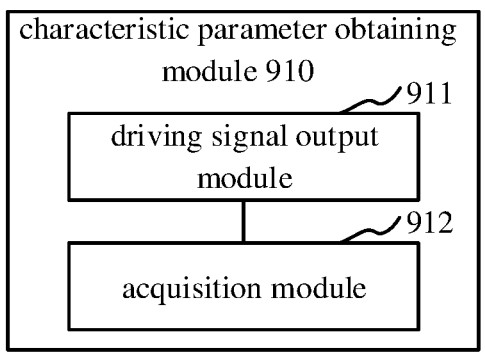
FIG. 10 is a block diagram of a characteristic parameter obtaining module according to an embodiment.

In one of the embodiments, as shown in FIG. 10, the characteristic parameter obtaining module 910 includes a driving signal output module 911 and an acquisition module 912.

The driving signal output module 911 is configured to output a driving signal. The driving signal is configured to drive a test circuit to output a test voltage. The test voltage is a pulse voltage including a forward voltage and a reverse voltage. The characteristic parameters include a voltage across a sampling resistor and a voltage across the e-liquid containing component for containing the e-liquid, when the forward voltage is applied. The sampling resistor and the e-liquid containing component are connected in series in the test circuit.

The acquisition module 912 is configured to acquire the characteristic parameters when the test circuit outputs the forward voltage.

In one of the embodiments, the driving signal output module 911 includes an access recognition module and a driving signal output module.

The access recognition module is configured to detect whether the e-liquid containing component 210 is connected.

The driving signal output module is configured to output the driving signal when recognizing that the e-liquid containing component 210 is connected. The driving signal is configured to drive a pulse circuit to output the pulse voltage. The pulse voltage includes the forward voltage configured to apply a high voltage to the e-liquid and the reverse voltage configured to balance the ionization of the e-liquid due to the forward voltage. When the forward voltage is output, the impedance of the e-liquid is detected.

Figure 11:
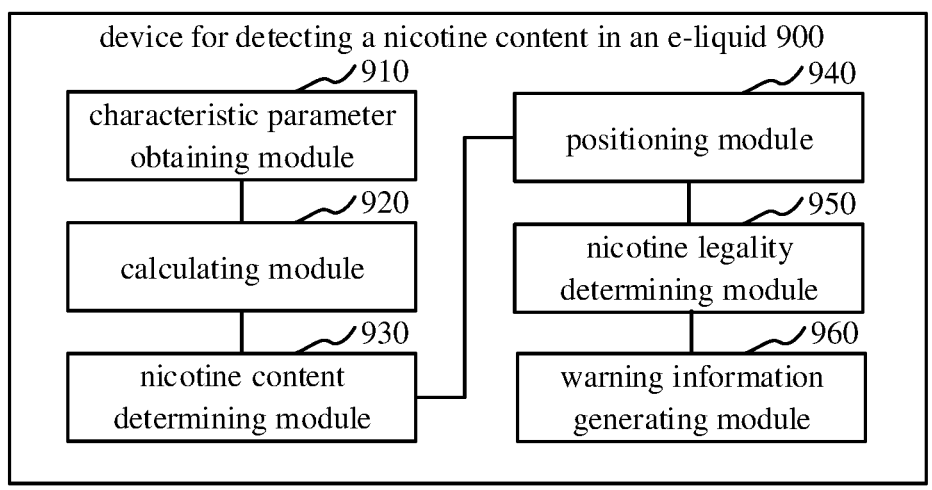
FIG. 11 is a block diagram of a device for detecting a nicotine content in an e-liquid according to another embodiment.

In one of the embodiments, as shown in FIG. 11, the device 900 for detecting the nicotine content in the e-liquid further includes a positioning module 940, a nicotine legality determining module 950, and a warning information generating module 960.

The positioning module 940 is configured to obtain a current geographic location.

The nicotine legality determining module 950 is configured to determine whether the nicotine content in the e-liquid meets a nicotine content regulation of the current geographic location according to the current geographic location and the preset regional nicotine content regulation.

The warning information generating module 960 is configured to generate warning information when the nicotine content in the e-liquid does not meet the nicotine content regulation.

Regarding the specific definition of the device for detecting the nicotine content in the e-liquid, the reference can be made to the above-mentioned definition of the method for detecting the nicotine content in the e-liquid, which will not be repeated here. Each of the modules in the above-mentioned device for detecting the nicotine content in the e-liquid can be implemented in whole or in part by software, hardware, and a combination thereof. The above-mentioned modules may be embedded in a processor in the computer device in a form of hardware or independent of the processor in the computer device, or may be stored in a memory of the computer device in a form of software, such that the processor can call and perform the operations corresponding to each module as described above.

Figure 12:
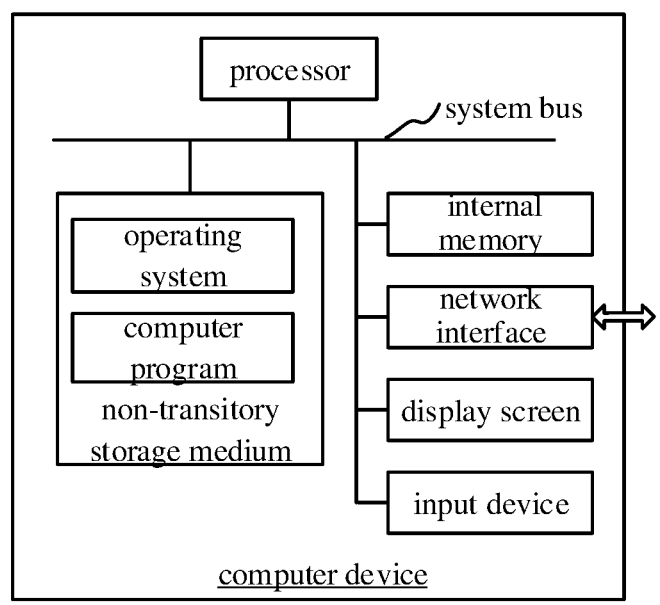
FIG. 12 is a diagram showing an inner structure of a computer device according to an embodiment.

In one of the embodiments, a computer device is provided. The computer device may be a terminal, and a diagram showing an internal structure thereof may be as shown in FIG. 12. The computer device includes a processor, a memory, a network interface, a display screen, and an input device connected via a system bus. The processor of the computer device is configured to provide calculation and control capabilities. The memory of the computer device includes a non-transitory storage medium and an internal memory. The non-transitory storage medium stores an operating system and a computer program. The internal memory provides an environment for an operation of an operating system and computer programs in the non-transitory storage medium. The network interface of the computer device is configured to communicate with an external terminal via a network connection. The computer program is executed by the processor to implement a method for detecting the nicotine content in the e-liquid. The display screen of the computer device can be a liquid crystal display screen or an electronic ink display screen. The input device of the computer device can be a touch layer covered on the display screen, or can be a keypad, a trackball, a touchpad, or the like disposed on a housing of the computer device.

Those skilled in the art can understand that the structure shown in FIG. 12 is only a block diagram showing a part of the structure related to the solution of the present application, and does not constitute a limitation on the computer device to which the solution of the present application is applied. The specific computer device may include more or fewer components than shown in the figure, or combining some components, or having a different arrangement of components.

In one of the embodiments, a computer device is provided, and which includes a memory and a processor storing a computer program therein. When executing the computer program, the processor implements the following steps:
  Obtaining characteristic parameters acquired by a sampling circuit. The characteristic parameters are configured to calculate an impedance of the e-liquid in an e-liquid containing component;
  Calculating the impedance of the e-liquid according to the characteristic parameters; and
  Determining the nicotine content in the e-liquid, according to the impedance of the e-liquid and a preset corresponding relation between the impedance and the nicotine content.

In one of the embodiments, when executing the computer program, the processor further implements the following steps:
  Outputting a driving signal; The driving signal is configured to drive a test circuit to output a test voltage. The test voltage is a pulse voltage including a forward voltage and a reverse voltage. The characteristic parameters include a voltage across a sampling resistor and a voltage across the e-liquid containing component for containing the e-liquid, when the forward voltage is applied. The sampling resistor and the e-liquid containing component are connected in series in the test circuit.
  Acquiring the characteristic parameters when the test circuit outputs the forward voltage; and
  Calculating the impedance of the e-liquid according to the characteristic parameters and a preset resistance value of the sampling resistor.

In one of the embodiments, when executing the computer program, the processor further implements the following steps:
  Detecting whether the e-liquid containing component is connected;
  Outputting the driving signal, if recognizing that the e-liquid containing component is connected.

In one of the embodiments, when executing the computer program, the processor further implements the following steps:
  Obtaining a current geographic location;
  According to the current geographic location and a preset regional nicotine content regulation, determining whether the nicotine content in the e-liquid meets the regional nicotine content regulation of the current geographic location; and Generating warning information, if the nicotine content regulation is not met.

In one of the embodiments, a computer-readable storage medium is provided, on which a computer program is stored. When the computer program is executed by a processor, the following steps are implemented:

Obtaining characteristic parameters acquired by a sampling circuit, and the characteristic parameters being configured to calculate an impedance of an e-liquid in an e-liquid containing component;

Calculating the impedance of the e-liquid according to the characteristic parameters; and Determining the nicotine content in the e-liquid, according to the impedance of the e-liquid and a preset corresponding relation between the impedance and the nicotine content.

In one of the embodiments, When the computer program is executed by a processor, the following steps are further implemented:

Outputting a driving signal; The driving signal is configured to drive a test circuit to output a test voltage. The test voltage is a pulse voltage including a forward voltage and a reverse voltage. The characteristic parameters include a voltage across a sampling resistor and a voltage across the e-liquid containing component for containing the e-liquid, when the forward voltage is applied. The sampling resistor and the e-liquid containing component are connected in series in the test circuit.

Acquiring the characteristic parameters when the test circuit outputs the forward voltage; and Calculating the impedance of the e-liquid according to the characteristic parameters and a preset resistance value of the sampling resistor.

In one of the embodiments, When the computer program is executed by a processor, the following steps are further implemented:

Detecting whether the e-liquid containing component is connected;

Outputting the driving signal, if recognizing that the e-liquid containing component is connected.

In one of the embodiments, when the computer program is executed by a processor, the following steps are further implemented:

Obtaining a current geographic location;

According to the current geographic location and a preset regional nicotine content regulation, determining whether the nicotine content in the e-liquid meets the regional nicotine content regulation of the current geographic location; and Generating warning information, if the nicotine content regulation is not met.

A person of ordinary skill in the art can understand that all or part of the processes in methods according to the above-mentioned embodiments can be implemented by instructing relevant hardware via a computer program, which can be stored in a non-transitory computer-readable storage medium. When the computer program is executed, the processes of the various methods according to the above-mentioned embodiments may be included. Where, any reference to memory, storage, database, or other medium used in the embodiments according to this application may include a non-transitory memory and/or a transitory memory. The non-transitory memory may include a read-only memory (ROM), a programmable ROM (PROM), an electrically programmable ROM (EPROM), an electrically erasable programmable ROM (EEPROM), or flash memory. The transitory memory may include a random access memory (RAM) or an external cache memory. As an illustration but not a limitation, RAM is available in many forms, such as static RAM (SRAM), dynamic RAM (DRAM), synchronous DRAM (SDRAM), double data rate SDRAM (DDRSDRAM), enhanced SDRAM (ESDRAM), synchlink DRAM (SLDRAM), Rambus direct RAM (RDRAM), direct memory bus dynamic RAM (DRDRAM), memory bus dynamic RAM (RDRAM), and the like.

The technical features of the above-mentioned embodiments can be combined arbitrarily. In order to simply the description, all possible combinations of the technical features in the above-mentioned embodiments are not described. However, as long as there is no contradiction in the combinations of these technical features, they should be considered to be fallen into the range described in the present specification.

Only several implementations of the present application are illustrated in the above-mentioned embodiments, and the description thereof is relatively specific and detailed, but it should not be understood as a limitation on the scope of the present application. It should be noted that for those of ordinary skill in the art, without departing from the concept of the present application, several modifications and improvements can be made, which all fall within the protection scope of the present application. Therefore, the protection scope of the present application shall be subject to the appended claims.

What is claimed is:

1. A system for detecting a nicotine content in an e-liquid, the system comprising:

a sampling circuit configured to acquire characteristic parameters, and the characteristic parameters being configured to calculate an impedance of the e-liquid in an e-liquid containing component;

wherein the sampling circuit comprises a sampling resistor configured to connect in series with the e-liquid containing component in a test circuit, and wherein test circuit is configured to apply a test voltage to the sampling resistor and the e-liquid containing component, the characteristic parameters comprise a voltage across the sampling resistor and a voltage across the e-liquid containing component after the test circuit applies the test voltage; and a controller electrically connected to the sampling circuit, and configured to calculate the impedance of the e-liquid according to the characteristic parameters fed back by the sampling circuit, and determine the nicotine content in the e-liquid according to the impedance of the e-liquid and a preset corresponding relation between the impedance and the nicotine content; and a positioning unit configured to position a current geographic location;

wherein the controller is configured to determine whether the nicotine content in the e-liquid meets a nicotine content regulation of the current geographic location according to the current geographic location and a preset regional nicotine content regulation, and generate warning information when the nicotine content in the e-liquid does not meet the nicotine content regulation.

2. The system according to claim 1, wherein the sampling circuit comprises:
a voltage acquisition circuit configured to acquire the characteristic parameters and feed the characteristic parameters back to the controller; and
wherein the controller is configured to calculate the impedance of the e-liquid according to a preset resistance value of the sampling resistor and the characteristic parameters, and determine the nicotine content in the e-liquid according to the impedance of the e-liquid and the preset corresponding relation between the impedance and the nicotine content.

3. The system according to claim 2, wherein:
the test circuit comprises a pulse circuit configured to output a pulse voltage comprising a forward voltage as the test voltage; and
the controller is further configured to drive the voltage acquisition circuit to acquire the characteristic parameters when the pulse circuit outputs the forward voltage, and to determine the nicotine content in the e-liquid after acquiring the characteristic parameters fed back by the voltage acquisition circuit.

4. The system according to claim 3, wherein the pulse voltage further comprises a reverse voltage, and is configured to balance an ionization of the e-liquid due to the forward voltage.

5. The system according to claim 2, wherein the controller is electrically connected to the test circuit, and is further configured to recognize whether the e-liquid containing component is connected, and drive the test circuit to output the test voltage when recognizing that the e-liquid containing component is connected.

6. The system according to claim 2, wherein the voltage acquisition circuit comprises:
a first amplifying circuit configured to amplify a voltage of the sampling resistor into a first amplified voltage and feed the first amplified voltage back to the controller; and
a second amplifying circuit configured to amplify a voltage of the e-liquid into a second amplified voltage and feed the second amplified voltage back to the controller.

7. The system according to claim 1, wherein the controller is further configured to determine feature information of the e-liquid according to a preset impedance test database and the impedance of the e-liquid, and generate feature prompt information configured to prompt a user of the feature information of the e-liquid currently used.

8. An electronic atomizing device, comprising the system according to claim 1.

9. The electronic atomizing device according to claim 8, further comprising:
a prompt component configured to generate prompt information from the nicotine content in the e-liquid, and the prompt information being configured to prompt a user of the nicotine content in the e-liquid currently used.

10. A method for detecting a nicotine content in an e-liquid, the method comprising:
obtaining characteristic parameters acquired by a sampling circuit, and the characteristic parameters being configured to calculate an impedance of the e-liquid in an e-liquid containing component;
calculating the impedance of the e-liquid according to the characteristic parameters; and
determining the nicotine content in the e-liquid, according to the impedance of the e-liquid and a preset corresponding relation between the impedance and the nicotine content;
obtaining a currently geographic location;
according to the current geographic location and a preset regional nicotine content regulation, determining whether the nicotine content in the e-liquid meets the regional nicotine content regulation of the current geographic location; and
generating warning information if the nicotine content regulation is not met.

11. The method according to claim 10, wherein obtaining the characteristic parameters acquired by the sampling circuit comprises:
outputting a driving signal, and wherein the driving signal is configured to drive a test circuit to output a test voltage, the test voltage is a pulse voltage comprising a forward voltage, the characteristic parameters comprise a voltage across a sampling resistor and a voltage across the e-liquid containing component for containing the e-liquid when the forward voltage is applied, and the sampling resistor and the e-liquid containing component are connected in series in the test circuit;
acquiring the characteristic parameters when the test circuit outputs the forward voltage; and
calculating the impedance of the e-liquid according to the characteristic parameters and a preset resistance value of the sampling resistor.

12. The method according to claim 11, wherein the pulse voltage further comprises a reverse voltage, and obtaining the characteristic parameters acquired by the sampling circuit further comprises: using the reverse voltage to balance an ionization of the e-liquid due to the forward voltage.

13. The method according to claim 11, wherein outputting the driving signal comprises:
detecting whether the e-liquid containing component is connected; and
outputting the driving signal, if recognizing that the e-liquid containing component is connected.

14. A device for detecting a nicotine content in an e-liquid, the device comprising:
a memory; and a processor storing a computer program therein, when the computer program being executed by the processor, the computer program causing the processor to implement a method including:
obtaining characteristic parameters acquired by a sampling circuit, and the characteristic parameters being configured to calculate an impedance of the e-liquid in an e-liquid containing component;
calculating the impedance of the e-liquid according to the characteristic parameters; determining the nicotine content of the e-liquid according to the impedance of the e-liquid and a preset corresponding relation between the impedance and the nicotine content;
obtaining a current geographic location;
according to the current geographic location and a preset regional nicotine content regulation, determining whether the nicotine content in the e-liquid meets the regional nicotine content regulation of the current geographic location; and
generating warning information if the nicotine content regulation is not met.

15. A computer device, comprising:
a memory; and
a processor storing a computer program therein, when executing the computer program, the processor implements the method according to claim 10.

16. A computer-readable storage medium, on which a computer program is stored, when the computer program is executed by a processor, the method according to claim 10 are implemented.

* * * * *